United States Patent
Gong et al.

(10) Patent No.: US 9,437,528 B1
(45) Date of Patent: Sep. 6, 2016

(54) DUAL-SIDE EXPOSED SEMICONDUCTOR PACKAGE WITH ULTRA-THIN DIE AND MANUFACTURING METHOD THEREOF

(71) Applicant: Alpha and Omega Semiconductor (Cayman) Ltd., Sunnyvale, CA (US)

(72) Inventors: Yuping Gong, Shanghai (CN); Xiaoming Sui, Shanghai (CN); Yan Yun Xue, Los Gatos, CA (US); Jun Lu, San Jose, CA (US)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 0 days.

(21) Appl. No.: 14/862,136

(22) Filed: Sep. 22, 2015

(51) Int. Cl.
*H01L 23/495* (2006.01)
*H01L 21/78* (2006.01)
*H01L 21/56* (2006.01)
*H01L 23/31* (2006.01)

(52) U.S. Cl.
CPC ....... *H01L 23/49541* (2013.01); *H01L 21/565* (2013.01); *H01L 21/78* (2013.01); *H01L 23/3107* (2013.01)

(58) Field of Classification Search
CPC .......... H01L 23/49541; H01L 21/565; H01L 21/78; H01L 23/3107
See application file for complete search history.

(56) References Cited

U.S. PATENT DOCUMENTS

| 8,163,601 | B2 | 4/2012 | Gong et al. | |
| 8,486,803 | B2 | 7/2013 | Huang et al. | |
| 8,659,128 | B2 | 2/2014 | Yang et al. | |
| 2006/0108672 | A1* | 5/2006 | Brennan | H01L 23/4827 257/676 |
| 2006/0110856 | A1* | 5/2006 | Kasem | H01L 23/49524 438/123 |
| 2010/0123243 | A1 | 5/2010 | Tzu | |
| 2011/0018116 | A1* | 1/2011 | Feng | H01L 29/0657 257/690 |

FOREIGN PATENT DOCUMENTS

| TW | 201126661 A1 | 8/2011 |
| TW | 201405748 A | 2/2014 |

* cited by examiner

*Primary Examiner* — Julio J Maldonado
*Assistant Examiner* — Farun Lu
(74) *Attorney, Agent, or Firm* — Chen-Chi Lin

(57) ABSTRACT

A dual-side exposed semiconductor package with ultra-thin die and a manufacturing method are disclosed. A die having a source electrode and a gate electrode at top surface is flipped and attached to a die paddle of a lead frame and then is encapsulated with a first molding compound. The first molding compound and the die are ground to reduce the thickness. A mask is applied atop the lead frame with the back of the flipped die exposed and a metal layer is deposited on the exposed area at the back of the flipped die. A metal clip is attached to the back of the flipped die. A second molding compound is deposited on the lead frame with the top surface of the metal clip exposed from the top surface of the second molding compound and the bottom surface of the lead frame exposed from the bottom surface of the second plastic molding compound.

19 Claims, 6 Drawing Sheets

DUAL-SIDE EXPOSED SEMICONDUCTOR PACKAGE WITH ULTRA-THIN DIE AND MANUFACTURING METHOD THEREOF

TECHNICAL FIELD

The present invention relates to a dual-side exposed semiconductor package with an ultra-thin die and a manufacturing method thereof.

BACKGROUND ART

In power MOSFET (Metal-Oxide Semiconductor Field Effect Transistor) application, resistance and thermal performance are two very important parameters. To improve the resistance and the thermal performance, a thin die is used in the semiconductor devices and the source or the drain of the FET (Filed Effect Transistor) is exposed. However, as a semiconductor wafer is ground to below 200 microns, it is likely to be cracked during grinding and in the subsequent cutting and packaging process. It is therefore necessary to develop a new packaging process to obtain a semiconductor package with low resistance and high heat dissipation.

SUMMARY OF THE INVENTION

The present invention provides a dual-side exposed semiconductor package with an ultra-thin die and a manufacturing method thereof. The ultra-thin die reduces the device resistance. Moreover, the source, the gate, and the drain terminals of the semiconductor package are exposed, which significantly improves the heat dissipation of the dual-side exposed semiconductor package.

The present invention also provides a method for manufacturing the dual-side exposed semiconductor package with an ultra-thin die, which includes the following steps:
preparing a die with a source electrode and a gate electrode at the top surface, which includes the following sub-steps: providing a wafer including a plurality of dies on the top surface; forming the source electrode and the gate electrode at the top surface of each die with Ni/Au electroplating or Cu pillars with a thickness from 10 microns to 20 microns; grinding from the back surface of the wafer to a thickness of about 300 microns to 400 microns; and cutting the wafer to separate the individual dies from the wafer;
providing a lead frame including a plurality of die paddles, each die paddle includes a source connecting pad, a gate connecting pad and drain connecting pads located at one side of the source connecting pad and the gate connecting pad respectively;
attaching one flipped die on the top surface of one die paddle;
depositing a first molding compound on the top surface of the lead frame fully covering the flipped die attached to the lead frame and uncovering the drain connecting pads, the thickness of the first molding compound is about 450 microns to 500 microns;
grinding the top surface of the first molding compound and the back surface of the flipped die to thin the molding compound and the die and to expose the back surface of the flipped die from the top surface of the first molding compound, the thickness of the thinned first molding compound is equal to or less than 50 microns, which is equal to the total thickness of the thinned die and the source metal layer or the gate metal layer on the die;
depositing a mask layer atop the lead frame covering the lead frame, the first molding compound, but uncovering the exposed area of the back surface of the flipped die attached to the top surface of the lead frame;
depositing a back metal layer at the exposed area of the back surface of the flipped die, the metal layer is electrically connected to the drain region at the back of the die forming the drain electrode of the die, the back metal layer is a titanium-nickel-silver alloy and has a thickness of 20 microns;
removing the mask layer;
attaching a metal clip on the back surface of the flipped die and the drain connecting pads;
depositing a second molding compound on the top surface of the lead frame covering the lead frame and the flipped die attached to the lead frame; the top surface of the metal clip is exposed from the top surface of the second molding compound, and the bottom surface of the lead frame is also exposed from the bottom surface of the second molding compound; and
cutting the lead frame and the second molding compound to separate a plurality of individual dual-side exposed semiconductor packages.

Optionally, the exposed surfaces of the lead frame and the metal clip are electroplated before the lead frame and the second molding compound are cut to separate the individual dual-side exposed semiconductor packages. The first molding compound and the second molding compound can be epoxy molding compounds.

The dual-side exposed semiconductor package with an ultra-thin die of the present invention includes:
a die with a source metal layer and a gate metal layer at the top surface of the die and a back metal layer at the back of the die; the source metal layer and a gate metal layer comprise Ni/Au electroplating or Cu pillars and has a thickness from 10 microns to 20 microns; the back metal layer is a titanium-nickel-silver alloy and having a thickness of 20 microns; wherein a total thickness of the die, the source metal layer or the gate metal layer and the back metal layer is less than or equal to 70 microns;
a die paddle comprises a source connecting pad, a gate connecting pad and drain connecting pads located at one side of the source connecting pad and at one side of the gate connecting pad respectively; the die is flipped and attached to the die paddle with the source metal layer attached to the source connecting pad and the gate metal layer attached to the gate connecting pad;
a first molding compound covering the die but uncovering the drain connecting pads, wherein the back surface of the flipped die is exposed from top surface of the first molding compound, the thickness of the first molding compound is equal to the thickness of the die plus and the thickness of the source metal layer or the gate metal layer on the die, which is about 50 microns;
a metal clip having a bridge shape, the horizontal portion of the metal clip is electrically connected with the back metal layer at the back surface of the flipped die, and the vertical portion of the metal clip is connected to the drain connecting pad on the die paddle; and
a second molding compound covering the die, the first molding compound, the metal clip and the die paddle, the top surface of the horizontal portion of the metal clip is exposed from the top surface of the second molding compound forming the top drain terminal of the dual-side exposed semiconductor package with an ultra-thin die, and the bottom surfaces of the source connecting pad, the gate connecting pad and the drain connecting pads of the die paddle are exposed from the bottom surface of the second molding compound forming the source terminal, the gate terminal and the bottom drain terminal of the dual-side exposed semiconductor package with an ultra-thin die respectively.

DETAILED DESCRIPTION OF THE INVENTION

FIG. 1 to FIG. 12 illustrate a method for manufacturing a dual-side exposed package with an ultra-thin die in examples of the present invention. The method includes the following steps:

preparing a die with a source electrode and a gate electrode at the top surface thereof;

providing a lead frame including a plurality of die paddles;

attaching one flipped die to the top surface of one die paddle;

depositing a first molding compound on the top surface of the lead frame covering the flipped dies attached to the lead frame;

grinding the top surface of the first molding compound and the back surface the flipped dies to thin the molding compound and the dies and to expose the back surface of the flipped dies from the top surface of the first molding compound;

depositing a mask layer atop the lead frame covering the lead frame and the first molding compound but uncovering the exposed area of the back surface of each flipped die;

removing the mask layer;

depositing a back metal layer at the exposed back surface of the flipped die;

attaching a metal clip on the exposed back surface of the flipped die;

depositing a second molding compound on the top surface of the lead frame covering the lead frame and the flipped dies, the top surface of each metal clip is exposed from the top surface of the second molding compound, and the bottom surface of the lead frame is also exposed from the bottom surface of the second molding compound; and forming Tin plating on the top exposed surface of the metal clip and on the bottom exposed surface of the lead frame, which is an optional step for preventing the oxidation of the exposed areas of the metal clip and the lead frame and facilitating the connection in SMT (Surface Mounting Technology); and cutting the lead frame and the second molding compound to separate a plurality of individual dual-side exposed semiconductor packages.

The preparation of the die comprises the following sub-steps:

providing a wafer including a plurality of die on the top surface;

forming the source electrode and the gate electrode on the top of each die on the wafer;

grinding from the back surface of the wafer to thin the wafer; and cutting the wafer to separate the individual dies from the wafer.

Figure 1:
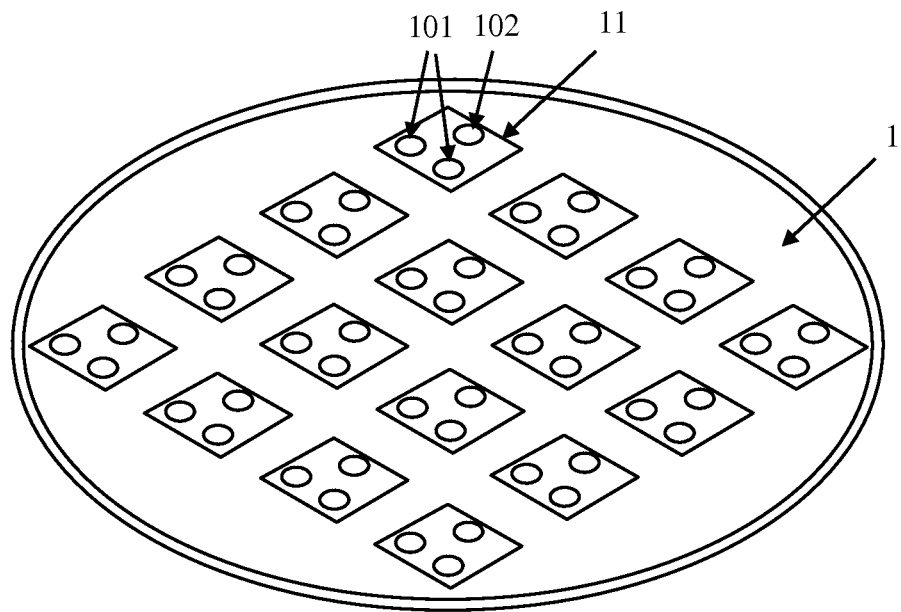
FIG. 1 is a schematic diagram of the top view of a wafer including a plurality of dies, each of the plurality of dies includes a source electrode and a gate electrode made of Ni/Au electroplating or Cu pillar.
Figure 2:
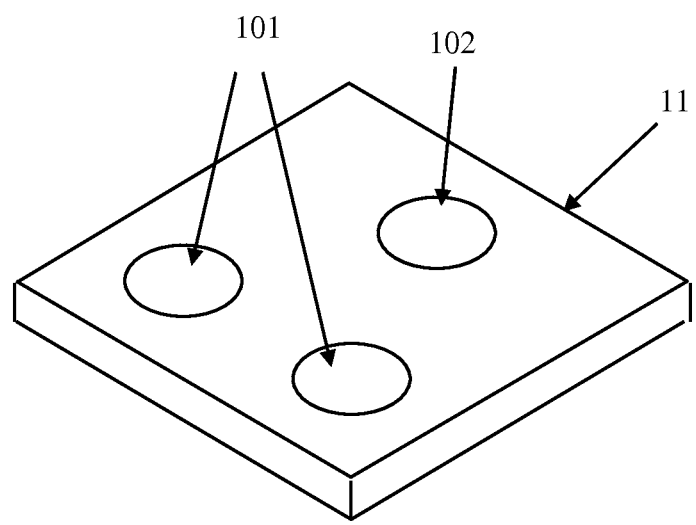
FIG. 2 is a schematic diagram of an individual die.

As shown in FIG. 1, a semiconductor wafer 1 comprises a plurality of dies 11, which can be power MOSFETs. Each power MOSFET 11 includes a source region (not shown) and a gate region (not shown) located at the top surface of the die, and a drain region (not shown) located at the bottom (back) of the die. Ni/Au electroplating or Cu pillar is deposited at the top surface of the wafer 1 forming a source metal layer 101 and a gate metal layer 102 on each die 11. The source metal layer 101 is electrically connected with the source region of the die forming the source electrode of the die 11, and the gate metal layer 102 is electrically connected with the gate region of the die forming the gate electrode of the die 11. In one example, the thickness of the source metal layer 101 and the gate metal layer 102 is greater than 5 microns, preferably about 10 microns to 20 microns. The wafer 1 is then ground from the bottom surface to a thickness from 300 microns to 400 microns. As shown in FIG. 2, an individual die 11 singulated from the wafer 1 has a thickness of about 300 microns to 400 microns.

Figure 3:
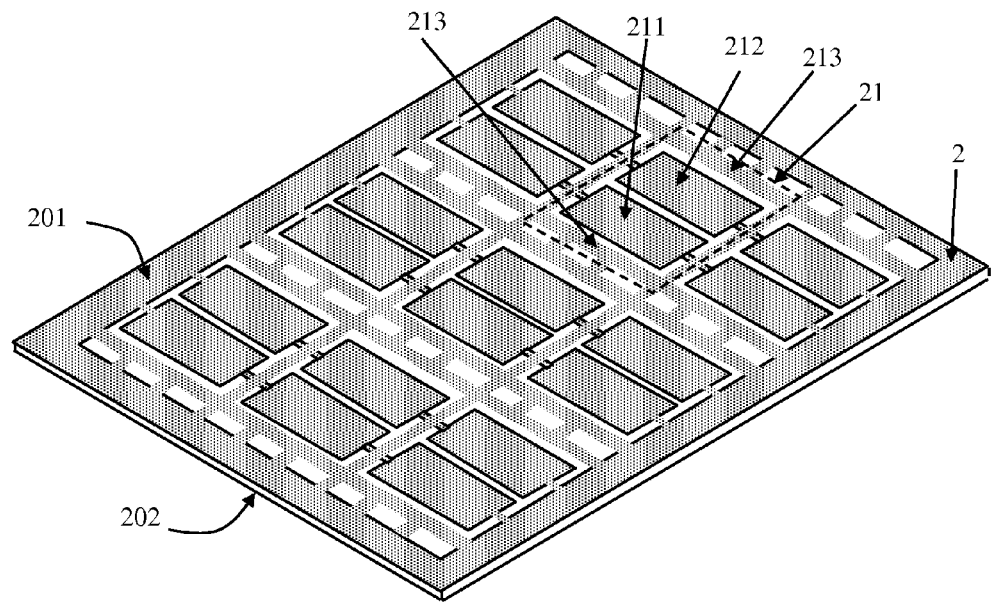
FIG. 3 is a schematic diagram of a lead frame.

As shown in FIG. 3, a strip flat lead frame 2 made of a conductive material and having a top surface 201 and a bottom surface 202 includes a plurality of die paddles 21 (dashed line) connecting together in an array. Each die paddle 21 includes a source connecting pad 211 and a gate connecting pad 212. In an example as shown in FIG. 3, the die paddle 21 also includes drain connecting pads 213 located near one side of the source connecting pad 211 and near one side of the gate connecting pad 212 respectively. In another example, the die paddle 21 of the lead frame 2 does not include any drain connecting pads (not shown).

Figure 4:
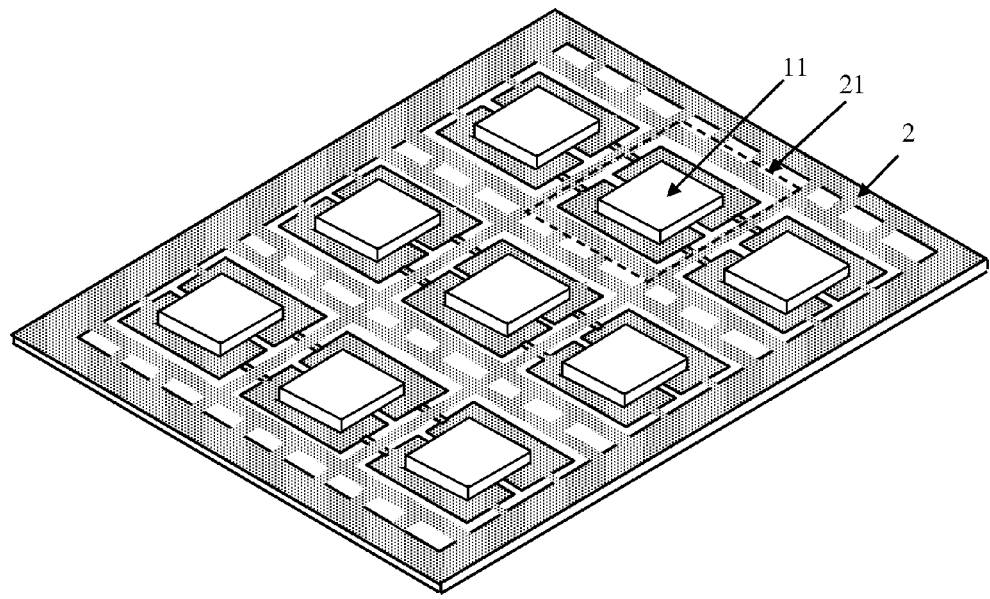
FIG. 4 is a schematic diagram illustrating the attachment of flipped dies on to the lead frame.

As shown in FIG. 4, one die 11 is flipped and attached to one die paddle 21 of the lead frame 2, where the source metal layer 101 on the die 11 is attached to the source connecting pad 211 of the die paddle 21 of the lead frame 2, and the gate metal layer 102 on the die 11 is attached to the gate connecting pad 212 of the die paddle 21 of the lead frame 2.

Figure 5:
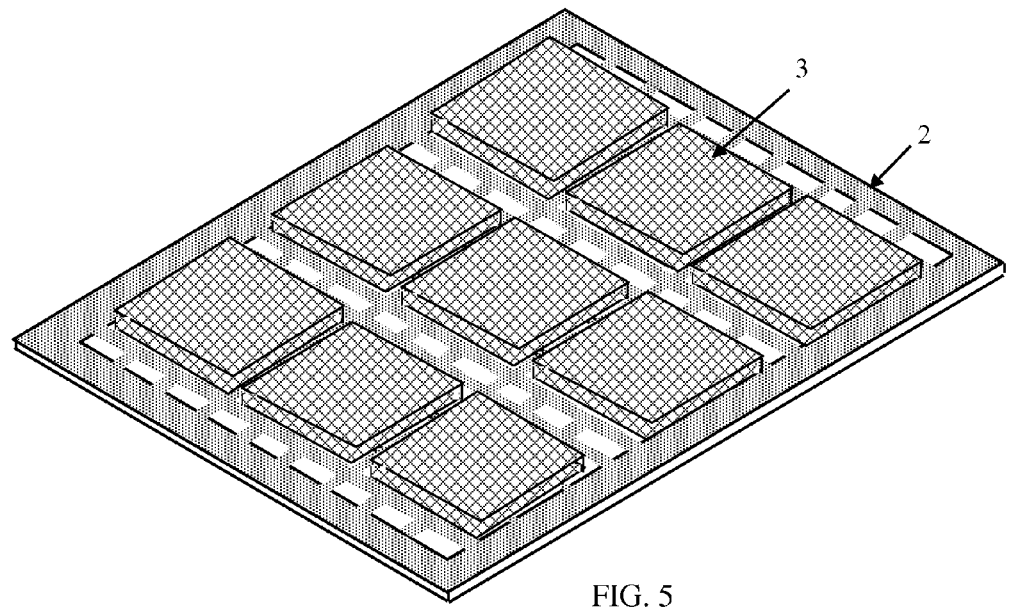
FIG. 5 is a schematic diagram illustrating the formation of a first molding compound encapsulating the dies attached to the lead frame.

As shown in FIG. 5, a first molding compound 3 is deposited to encapsulate each die 11 attached to the die paddle 21 of the lead frame 2 without covering the drain connecting pads 213. The thickness of the first molding compound 3 is about 450 microns to 500 microns to fully cover the die 11. The first molding compound 3 can be an epoxy molding compound.

Figure 6:
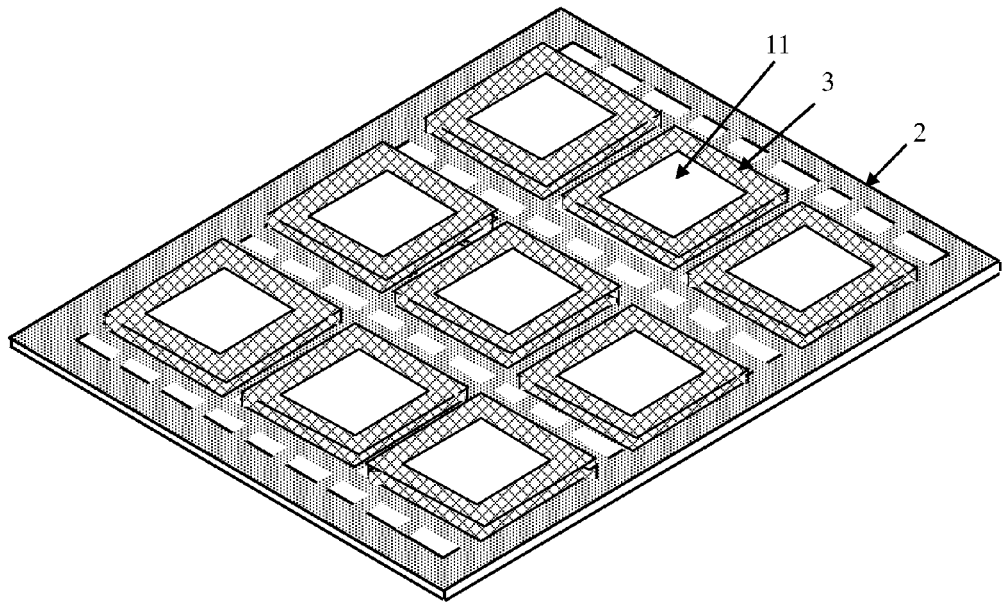
FIG. 6 is a schematic diagram illustrating grinding of the first molding compound and the dies.

As shown in FIG. 6, the first molding compound 3 and the flipped die 11 are ground from the top surface of the first molding compound 3 exposing the drain region at the back surface of the flipped die 11. The thickness of the thinned first molding compound 3 is equal to the sum of the thicknesses of the thinned die 11 and the source metal layer 101 or the gate metal layer 102 formed on the die 11. For example, when the thickness of the source metal layer 101 or the gate metal layer 102 is 20 microns and the thickness of the thinned die 11 is 30 microns, the thickness of the thinned first molding compound 3 is 50 microns. In the method of the present invention, the grinding process for reducing the thickness of the die is applied to the individual die instead of the wafer thus preventing the wafer from fracturing due to uneven pressure applied in the grinding process. In this grinding process, the first molding compound 3 supports the ultra-thin die 11 from fracturing.

Figure 7:
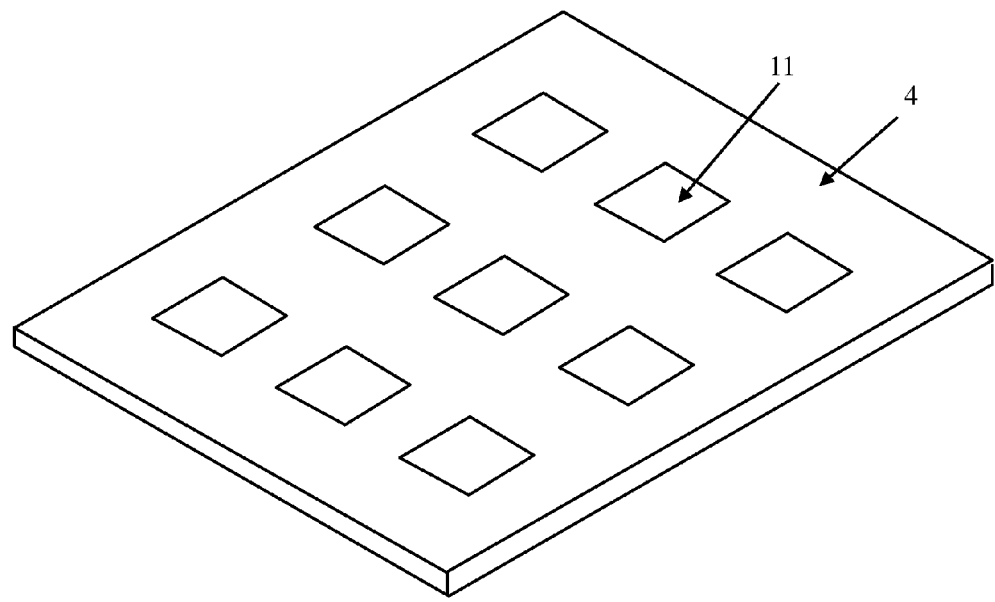
FIG. 7 is a schematic diagram illustrating placing a mask layer on the lead frame.

As shown in FIG. 7, a mask layer 4 is placed atop the lead frame 2 covering all areas excepting the drain region at the back of the flipped die 11 on lead frame 2. The mask layer 4 can be made of the photo resist and is applied before depositing a back metal layer at the back of the die 11, and then the mask layer 4 is removed after the back metal layer 103 of FIG. 10 is deposited.

Figure 10:
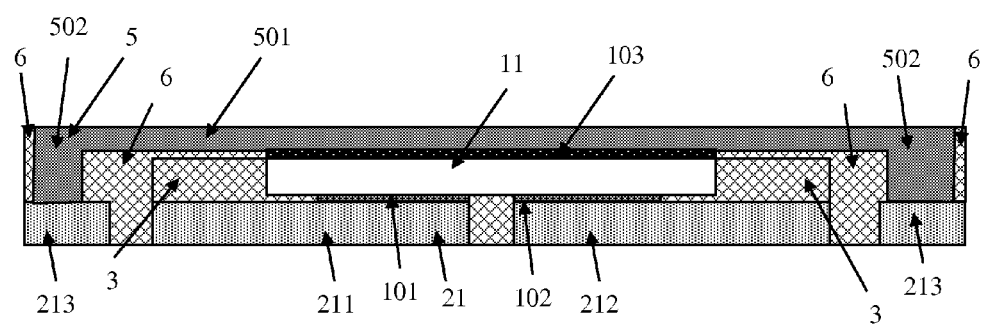
FIG. 10 is a cross-sectional view of an individual dual-side exposed semiconductor package.

As shown in FIG. 10, the back metal layer 103 is deposited at the back of the die 11 and can be made of a Ti—Ni—Ag alloy with a thickness larger than 5 microns, preferably about 10 microns to 20 microns and the back metal layer 103 is electrically connected with the drain region at the back of the die 11 forming the drain electrode of the die 11.

Figure 8:
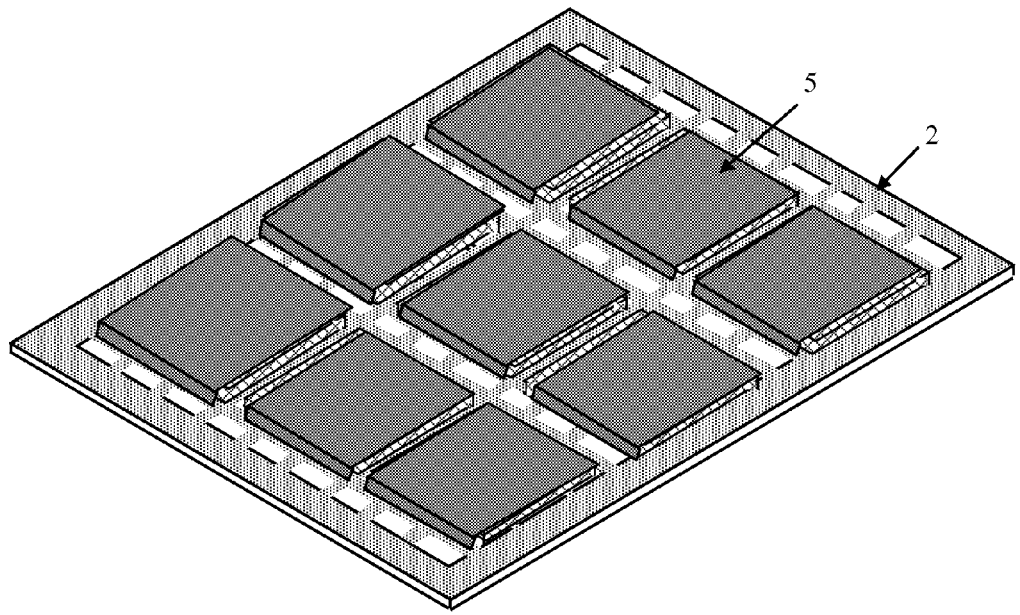
FIG. 8 is a schematic diagram illustrating the attachment of a metal clip on the back of each flipped die.

As shown in FIG. 8 and FIG. 10, a metal clip 5 is mounted atop the back metal layer 103 at the back of the die 11 attached to the die paddle 21 of the lead frame 2, as such the back metal layer 103 are electrically connected to the drain connecting pads 213 of the die paddle 21 by the metal clip 5. The metal clip 5 can be in a bridge shape with the horizontal portion 501 in contact with the back metal layer 103 at the back of the die 11, and the vertical portions 502 connected to the drain connecting pads 213 of the die paddle 21 of the lead frame 2. In this process, an array of metal clips 5 is mounted on the lead frame 2 with each metal clip attached to the back metal layer 103 of each die 11. As shown in FIG. 10, the metal clip 5 includes two vertical portions 502 that are symmetric with respect to the horizontal portion 501. Alternatively, the metal clip may include only a single vertical portion. In another example, when the die paddles of the lead frame 2 do not include any the drain connecting pad (not shown), the vertical portion 502 of the metal clip 5 extends to the plane coplanar with the plane of the source connecting pad 211 and the gate connecting pad 212 of the die paddle 21 (not shown).

Figure 9:
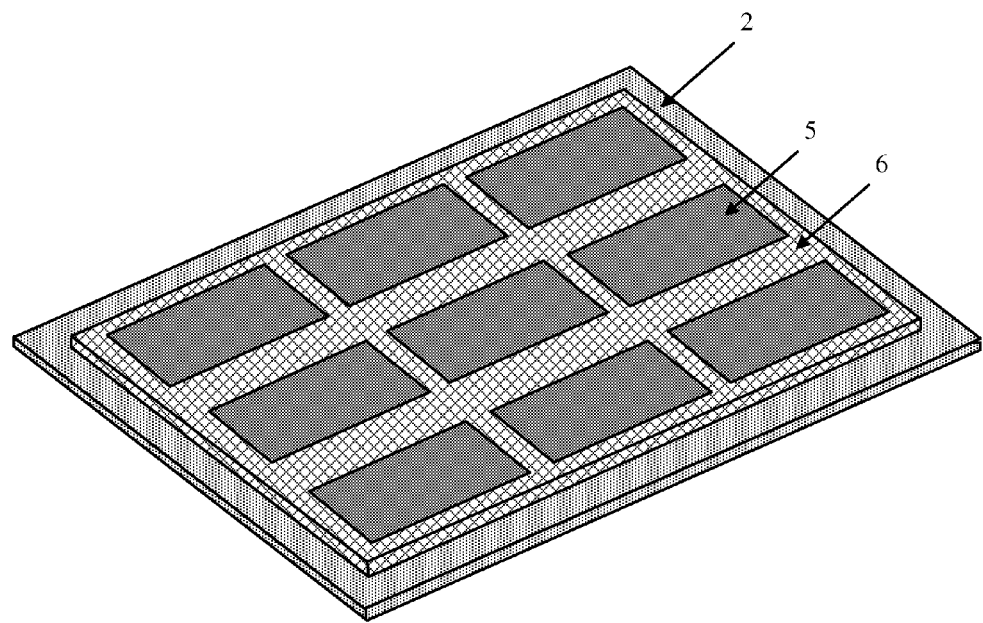
FIG. 9 is a schematic diagram illustrating the formation of a second molding compound covering the lead frame and the dies with the top surface of the metal clips exposed.

As shown in FIG. 9, a second molding compound 6 is deposited from the top surface of the lead frame 2 covering the top surface of the lead frame 2 and the die 11 attached thereon with the top surface of the horizontal portion 501 of the metal clip 5 exposed from the top surface of the second molding compound 6 and the bottom surface of the lead frame 2 also exposed from the bottom surface of the second molding compound 6.

FIG. 10 shows a cross-sectional view of a dual-side exposed semiconductor package with an ultra-thin die formed by the method of FIG. 1 to FIG. 9 of the present invention. The dual-side exposed semiconductor package includes:

a die 11 with a source metal layer 101 and a gate metal layer 102 at the top surface of the die 11 and a back metal layer 103 at the back surface of the die 11; the thickness of the die, the source or gate metal layer and the back metal layer is less than or equal to 70 microns;

a die paddle 21 including a source connecting pad 211, a gate connecting pad 212 and drain connecting pads 213 located near one side of the source connecting pad 211 and near one side of the gate connecting pad 212 respectively; each die 11 is flipped and attached to the die paddle 21 with the source metal layer 101 at the top surface of the die attached to the source connecting pad 211 of the die paddle 21, and the gate metal layer 102 at the top surface of the die attached to the gate connecting pad 212 of the die paddle 21;

a first molding compound 3 surrounding the die 11 and covering top surface of the source connecting pad 211 and gate connecting pad 212 of the die paddle 21 but not covering the drain connecting pads 213 of the die paddle 21 with the back of the die 11 exposed from the top surface of the first molding compound 3;

a metal clip 5 in a bridge shape mounted atop the die paddle 21, the horizontal portion 501 of the metal clip 5 is in contact with the back metal layer 103 at the back of the flipped die 11, and the vertical portion 502 of the metal clip 5 is connected to the drain connecting pads 213 of the die paddle 21; and a second molding compound 6 surrounding the die 11, covering the second molding compound 3, the metal clip 5 and the die paddle 21 with the top surface of the horizontal portion 501 of the metal clip 5 exposed from the top surface of the second molding compound 6, and the bottom surfaces of the source connecting pad 211, the gate connecting pad 212 and the drain connecting pads 213 of the die paddle 21 exposed from the bottom surface of the second molding compound 6.

Figure 11:
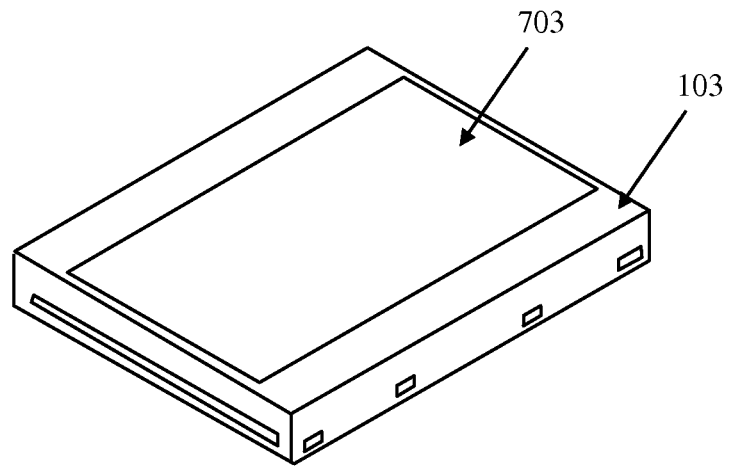
FIG. 11 is a schematic diagram illustrating a top view of the individual dual-side exposed semiconductor package.
Figure 12:
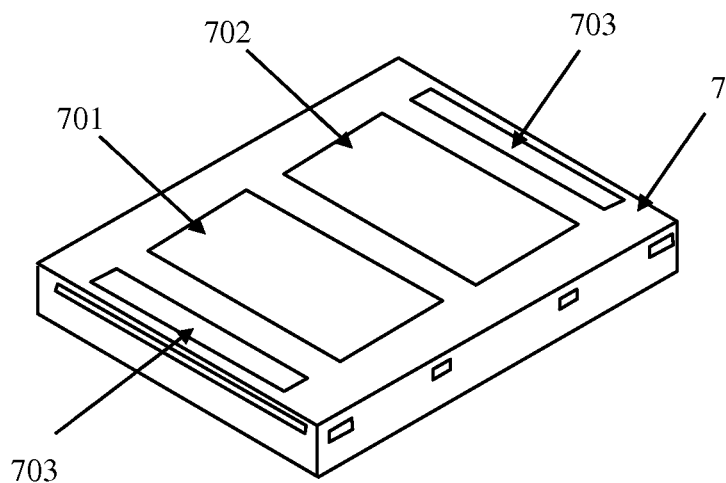
FIG. 12 is a schematic diagram illustrating the bottom view of the individual dual-side exposed semiconductor package.

As shown in FIG. 11 and FIG. 12, the top surface of the horizontal portion 501 of the metal clip 5 exposed from top surface of the second molding compound 6 forms the top drain terminal 703 of the dual-side exposed semiconductor package 7 with an ultra-thin die, and the bottom surface of the drain connecting pads 213, which has a top surface connected to the vertical portion 502 of the metal clip 5, of the die paddle 21 exposed from the bottom surface the second molding compound 6 forms the bottom drain terminal 703 of the dual-side exposed semiconductor package 7, while the bottom surface of the source connecting pad 211 of the die paddle 21 exposed from the bottom surface of the second molding compound 6 forms the source terminal 701 and the gate connecting pad 212 of the die paddle 21 exposed from the bottom surface of the second molding compound 6 forms the gate terminal 702 of the dual-side exposed semiconductor package 7 with an ultra-thin die.

The dual-side exposed semiconductor package with an ultra-thin die of the present invention includes the source, the gate, and the drain terminals that are all exposed. As such, the heat dissipation of the device package is significantly improved. In addition, the ultra-thin die reduces the resistance of the device package.

Those of ordinary skill in the art may recognize that modifications of the embodiments disclosed herein are possible. For example, the thickness of the first molding compound may vary. Other modifications may occur to those of ordinary skill in this art, and all such modifications are deemed to fall within the purview of the present invention, as defined by the claims.

The invention claimed is:

1. A method for manufacturing dual-side exposed semiconductor packages with ultra-thin dies, the method comprising the steps of:

preparing a plurality of dies, each of the plurality of dies having a source electrode and a gate electrode on a top surface of said each of the plurality of dies;

providing a lead frame including a plurality of die paddles, said each of the plurality of dies being flipped and the top surface of said each of the plurality of flipped dies being attached to a respective die paddle of the plurality of die paddles;

depositing a respective molding compound of a plurality of molding compounds on each of the plurality of flipped dies;

grinding at top surfaces of the plurality of molding compounds so as to thin the plurality of molding compounds and to expose back surfaces of the plurality of flipped dies, and then grinding at top surfaces of the plurality of thinned molding compounds and the exposed back surfaces of the plurality of flipped dies so as to further thin the plurality of thinned molding compounds and the plurality of flipped dies;

depositing a mask layer covering the lead frame and the plurality of further thinned molding compounds;

depositing a respective back metal layer of a plurality of back metal layers on an exposed back surface of each of the plurality of further thinned flipped dies;

removing the mask layer;

attaching a respective metal clip of a plurality of metal clips to each of the plurality of back metal layers;

depositing a molding compound layer covering the lead frame and surrounding the plurality of further thinned flipped dies so as to form a processed lead frame, top surfaces of the plurality of metal clips being exposed and a bottom surface of the lead frame being exposed; and singulating the dual-side exposed semiconductor packages from the processed lead frame.

2. The method of claim 1, further comprising:

before the step of singulating the dual-side exposed semiconductor packages from the processed lead frame, forming tin plating on the exposed top surfaces of the plurality of metal clips and the exposed bottom surface of the lead frame.

3. The method of claim 1, the step of preparing the plurality of dies comprising the sub-steps of:

preparing a wafer having the plurality of dies, the top surface of said each of the plurality of dies having a source region and a gate region;

electroplating a source metal layer on the source region so as to form the source electrode and electroplating a gate metal layer on the gate region so as to form the gate electrode grinding at a back surface of the wafer; and singulating the plurality of dies from the ground wafer.

4. The method of claim 3, wherein a thickness of a selected molding compound the plurality of further thinned molding compounds is equal to or less than 50 microns, and wherein the thickness of the selected molding compound is equal to a sum of a thickness of a selected die of the plurality of further thinned flipped dies and a thickness of the source metal layer.

5. The method of claim 3, wherein a thickness of the source metal layer is from 10 microns to 20 microns and a thickness of the gate metal layer is from 10 microns to 20 microns.

6. The method of claim 3, wherein a thickness of the ground wafer is from 300 microns to 400 microns.

7. The method of claim 1, wherein the lead frame is a flat plate, wherein each of the plurality of die paddles comprises a source connecting pad, a gate connecting pad and first and second drain connecting pads, and wherein the first drain connecting pads and the second drain connecting pads are separated by the source connecting pad and the gate connecting pad.

8. The method of claim 7, wherein the first and second drain connecting pads are electrically connected to the plurality of metal clips.

9. The method of claim 8, wherein the exposed top surfaces of the plurality of metal clips form top drain terminals, wherein the first and second drain connecting pads form bottom drain terminals, wherein the source connecting pad of each of the plurality of die paddles form a respective source terminal, and wherein the gate connecting pad of each of the plurality of die paddles form a respective gate terminal.

10. The method of claim 1, wherein a thickness of the plurality of further thinned molding compounds is from 450 microns to 500 microns.

11. The method of claim 1, wherein the plurality of back metal layers are titanium-nickel-silver alloys and are electrically connected with drain regions of the back surfaces of the plurality of further thinned flipped dies so as to form a plurality of drain electrodes.

12. The method of claim 11, wherein a thickness of the plurality of back metal layers is 20 microns.

13. The method of claim 1, wherein the plurality of molding compounds and the molding compound layer are epoxy molding compounds.

14. A dual-side exposed semiconductor package with an ultra-thin die, comprising:

a die having a source metal layer and a gate metal layer on a top surface of the die and a back metal layer on a back surface of the die, wherein a thickness of the die is less than or equal to 70 microns;

a lead frame having a die paddle, the die paddle comprising a source connecting pad, a gate connecting pad and first and second drain connecting pads, wherein the first drain connecting pads and the second drain connecting pads are separated by the source connecting pad and the gate connecting pad, and wherein the die is flipped and attached to the die paddle with the source metal layer attached to the source connecting pad and the gate metal layer attached to the gate connecting pad;

a first molding compound covering the die, wherein the first drain connecting pads and the second drain connecting pads are not covered by the first molding compound, and wherein the back surface of the flipped die is exposed from the first molding compound;

a metal clip having a bridge shape, wherein a horizontal portion of the metal clip is electrically connected to the back metal layer and a vertical portion of the metal clip is connected to the first drain connecting pads; and a second molding compound surrounding the die and the metal clip and covering the first molding compound and the die paddle, wherein a top surface of the horizontal portion of the metal clip is exposed from a top surface of the second molding compound, and wherein bottom surfaces of the source connecting pad, the gate connecting pad and the first and second drain connecting pads are exposed from a bottom surface of the second molding compound.

15. The dual-side exposed semiconductor package with the ultra-thin die of claim 14, wherein the source metal layer and the gate metal layer comprise Ni/Au electroplating or Cu pillar, wherein the source metal layer is electrically connected to a source region of the top surface of the die so as to form a source electrode, wherein the gate metal layer is electrically connected to a gate region of the top surface of the die so as to form a gate electrode, and wherein a thickness of the source metal layer is from 10 microns to 20 microns and a thickness of the gate metal layer is from 10 microns to 20 microns.

16. The dual-side exposed semiconductor package with the ultra-thin die of claim 14, wherein the back metal layer is a titanium-nickel-silver alloy, wherein the back metal layer is electrically connected to a drain region of the back surface of the flipped die so as to form a drain electrode, and wherein a thickness of the back metal layer is 20 microns.

17. The dual-side exposed semiconductor package with the ultra-thin die of claim 14, wherein the lead frame is made of a conductive material.

18. The dual-side exposed semiconductor package with the ultra-thin die of claim 14, wherein a thickness of the first molding compound is 50 microns.

19. The dual-side exposed semiconductor package with the ultra-thin die of claim 14, wherein the exposed horizontal portion of the metal clip forms a top drain terminal, wherein bottom surfaces of the first and second drain connecting pads form bottom drain terminals, wherein a bottom surface of the source connecting pad forms a source terminal, and wherein a bottom surface of the gate connecting pad forms a gate terminal.

* * * * *